United States Patent [19]

Onishi et al.

[11] Patent Number: 5,414,653
[45] Date of Patent: May 9, 1995

[54] NON-VOLATILE RANDOM ACCESS MEMORY HAVING A HIGH LOAD DEVICE

[75] Inventors: Shigeo Onishi, Nara; Kazuya Ishihara, Tenri; Kenichi Tanaka, Fukuyama; Keizo Sakiyama, Kashihara, all of Japan

[73] Assignee: Sharp Kabushiki Kaisha, Osaka, Japan

[21] Appl. No.: 132,292

[22] Filed: Oct. 6, 1993

[51] Int. Cl.⁶ .............................................. G11C 11/22
[52] U.S. Cl. ..................................... 365/145; 365/149; 257/295
[58] Field of Search ................. 365/145, 149; 257/295

[56] References Cited

U.S. PATENT DOCUMENTS 5,070,385  12/1991  Evans, Jr. et al. ............. 365/145 X
5,121,353  6/1992  Natori ................................. 365/145

Primary Examiner—Joseph A. Popek
Attorney, Agent, or Firm—Nixon & Vanderhye

[57] ABSTRACT

A non-volatile random access memory comprising a plurality of unit cells each of which includes; a transistor composed of source/drain and gate electrodes, a ferroelectric capacitor connected to either of the source/drain electrodes and a high load device connected to both of the ferroelectric capacitor and the source/drain electrodes being connected to the ferroelectric capacitor.

4 Claims, 10 Drawing Sheets

WRITE 1

WRITE 0

STAND BY

STAND BY

READ 1

READ 0

NON-VOLATILE RANDOM ACCESS MEMORY HAVING A HIGH LOAD DEVICE

BACKGROUND OF THE INVENTION

1. Field of the Invention

This invention relates to a non-volatile random access memory (Ferroelectric RAM; FRAM) having a high load device, and more particularly to a non-volatile random access memory having a ferroelectric capacitor and a high load device.

2. Description of the Prior Art

Conventionally known typical memories capable of random access to stored data include SRAM's (static RAM's) and DRAM's (dynamic RAM's). All these conventional memories are volatile. SRAM's require six transistor devices per one memory cell so that they are limited at the degree of integration. DRAM's have the drawback that the capacitors require a periodical refreshment for holding data.

Under these circumstances, what is called FRAM's using a ferroelectric film as a capacitor are more and more noted as a non-volatile memory device capable of random access to data stored therein. Such FRAM utilizes a ferroelectric film having polarizing hysteresis property. Since polarizing charges remain even when an electric power is made OFF, the FRAM can be used as a non-volatile memory.

FIG. 10 shows a typical circuit configuration of such FRAM. As shown in FIG. 10, FRAM's basically comprise one memory cell including two transistor devices and two capacitor devices. In other words, an electrode on one side of the transistor T1 is connected to a bit line B1 while an electrode on the other side of the same transistor T1 is connected to one electrode on a transistor T2 via two capacitors C1 and C2. Furthermore, the other electrode on the transistor T2 is connected to a bit line B2. Besides, the gate electrodes on transistors T1 and T2 are connected to the same word line. A drive line is connected between the capacitors C1 and C2.

Such FRAM is written data by the polarization of one capacitor device produced by applying a high voltage or an earth voltage to the drive-line with a high voltage applied to one of the bit lines and an earth voltage applied to the other bit line. On the other hand, such FRAM is read data by detecting a difference in potential produced between one of the bit lines and the capacitor device when a high voltage is applied to the drive line with the bit lines serving as an earth potential.

However, the above FRAM requires two transistors and two capacitors per one memory cell. Thus the idea of a further increase in the memory capacity and a higher integration has produced a demand of further simplification of the device construction.

For the purpose of improving the problems, a FRAM comprising two transistors and one capacitor as shown FIG. 11(a) has been proposed.

In this type of FRAM as shown in FIGS. 11(b) and 11(c), the transistors T1 and T2 are formed on silicon substrate 51, providing four word lines 52 for one bit line 54. On both sides of the bit line 54, transistors T1 and T2 are respectively formed, sharing one of the diffused layer with each other. Each word line 52 is covered with a protective film 53. A contact pad 55 is formed on the silicon substrate 51 between the two word lines 52 in one unit cell and an interlayer insulating film 56 is formed thereon. A contact hole is formed on the contact pad 55 throughout the interlayer insulating film 56 and a contact plug 57 is embedded in the contact hole. Accumulating electrode 58 is formed on and connected to the contact plug 57, and further a ferroelectric PZT film 59 and cell plate 60 are sequentially laminated thereon, thereby forming a capacitor. Thus, a FRAM comprising two transistors T1 and T2 and one capacitor Cp can be obtained.

However, even in such a FRAM, the cell size of the unit cell in case of forming the gate electrode by 0.5 $\mu$m rule is about 3.7 $\mu m^2$ (in FIG. 2, C:1.5×2.45), therefore the device is required further minimization of the cell size and high integration.

In addition, a memory cell comprising one transistor and one capacitor, which is a ferroelectric type capacitor, has been proposed.

In the foregoing section, the behavior of one memory cell of FRAM will be detailed by way of FIG. 12.

At the Time of Writing Data (Write 1 or Write 0)

Application of a potential of $V_{cc}/2$ to the upper electrode of the capacitor device at the outset is followed by applying either $C_{cc}$ (in the case of Write 1) or 0 V (in the case of Write 0) to a bit line B1. Consequently, as shown in FIG. 12, the charge of the residual polarization each exhibiting a polarization in the reverse direction in the state of Write 1 and Write 0 is accumulated and stored in the capacitor.

At the Time of Waiting

At the time of waiting, the potential of the cell plate is set to $V_{cc}/2$ while a voltage of $V_{cc}/2$ is applied to the bit line, the state of polarization being kept as it is.

At the Time of Reading (Read 1 and Read 0)

The potential of the cell plate is set to $V_{cc}/2$ and a voltage of $V_{cc}$ is applied to the bit line B1. In the case of Read 1, since the polarization is not reversed, only a current of $I=(P_s-P_r)\Delta t$ ($P_s$ designates a charge of saturated polarization, $P_r$ a charge of the residual polarization, and $\Delta t$ reversion) is allowed to flow. On the other hand, in the case of Read 0, the polarization of the capacitor is reversed to provide a large variation in the charge so that a current of $I=\{2P_r+(P_s-P_r)\}/\Delta t$ is allowed to flow. The quantity of the current allows reading data "1" and "0" with a sense amplifier.

However, in actuality, the above FRAM has a drawback that the potential on the source side (lower electrode) of the cell plate is affected by the potential $V_{BB}$ of the back gate on the substrate, which reverses the direction of the electric field. As a consequence, the direction of polarization is reversed, so that refreshment operation is indispensable at the time of waiting.

BRIEF DESCRIPTION OF THE DRAWINGS

The present invention will be detailed in conjunction with the accompanying drawings.

SUMMARY OF THE INVENTION

Figure 1:
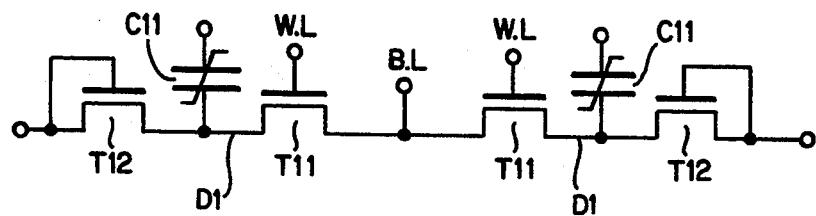
FIG. 1 is an equivalent circuit showing a FRAM of first embodiment of the present invention.

This invention has been made under the above circumstances. In particular, the object of the invention is to provide a FRAM that can further reduce the memory size.

Thus, this invention provides a non-volatile random access memory comprising a plurality of unit cells each of which includes;

a transistor composed of source/drain and gate electrodes, a ferroelectric capacitor connected to either of the source/drain electrodes and a high load device connected to both of the ferroelectric capacitor and the source/drain electrodes connected to the ferroelectric capacitor.

a transistor composed of source/drain and gate electrodes, a ferroelectric capacitor connected to one of the source/drain electrodes and a high load device connected to both the ferroelectric capacitor and the source/drain electrodes being connected to the ferroelectric capacitor.

DETAILED DESCRIPTION OF THE PREFERRED EMBODIMENT

The FRAM of this invention comprises a plurality of unit cells in which each unit cell comprises one MOS transistor, one ferroelectric capacitor and a high load device.

Alternatively, the high load device of the FRAM of the invention may be shared with another high load device of adjacent cell, thereby forming 1.5 transistor-one capacitor type FRAM.

The non-volatile FRAM of the invention is formed on a semiconductor substrate. The semiconductor substrate used in a FRAM is not limited to a particular type as long as it can be normally used as a semiconductor substrate, but a silicon substrate is preferable for this invention.

AMOS transistor formed on this semiconductor substrate can be formed with a known method. For example, a device isolation region is formed with the LOCOS process and then a gate oxide film is formed to a thickness of 100 to 800 angstroms. Then a polysilicon that forms a gate electrode is deposited to a thickness on the order of 3500 to 4000 angstroms with a known method, e.g., the CVD method. In addition, the source/drain region can be formed by implanting either a P-type or an N-type ions with an accelerated energy of 40 to 80 KeV and the order of 1 to $3 \times 10^{15}$ ions/cm$^2$.

A capacitor in the non-volatile memory of this invention can be formed of polysilicon, platinum/TiN/polysilicon, Ti/polysilicon, platinum as a lower electrode and as an upper electrode to a thickness on the order of 2000 to 3000 angstroms. A capacitor insulating film can be formed of a ferroelectric film such as PZT, PLZ or PLZT. The thickness of the capacitor insulating film ranges about 1000 to 3000 angstroms. It can be formed with the sputtering process or the like. Incidentally, a bit line contact pad may be formed with a material same as the counterpart used in the lower electrode at a portion to which the bit line is connected along with the formation of the lower electrode. Alternatively, the bit contact pad may be formed with a material of polysilicon or metal silicide having a high melting point.

In the non-volatile memory of the present invention, the bit line can be formed above the transistor and capacitor and also can be formed between the transistor and capacitor. The bit line can be formed by a known method, for example with polycide comprising Al, polysilicon, tungsten and the like.

Furthermore, an interlayer insulating film may be formed between the transistor and capacitor. Alternatively, it may be formed after the transistor and the capacitor are formed. The material of the interlayer insulating film is not limited to any particular type, but a SiO$_2$, SOG or BPSG (borophosphosilicate glass) film is preferable. The thickness of the film is preferably in the range of about 6000 to 8000 angstroms. Subsequently, the film is planerized preferably by ECR or spattering method in case of using SiO$_2$ film, by a known etch back method in case of using SOG film, and at about 600 to 800° C. under vapor atmosphere in case of using BPSG. On the interlayer insulating film Al, Al—Si and the like are deposited to a thickness of about 4000 to 5000 angstroms, which is patterned into a desired configuration to form a metal wiring layer.

A high load device used in a FRAM of this invention may be formed by giving a high threshold voltage to a general transistor. As for a resistor, polysilicon with high resistance may be used.

In order to inhibit such reversion of the polarization of capacitors with certainty, the resistance value of the high-load device such as the resistor, the high-load transistor and the load transistor is preferably set to 1MΩ or more.

An embodiment of the basic circuit construction of FRAM according to the invention will be detailed hereinbelow.

Embodiment 1

As shown in FIG. 1, a unit cell comprises a transistor T11, a capacitor C11 connected to a drain D1 which is one of the electrode of the transistor T11, and a load transistor T12 sharing a drain D1 of the transistor T11 as a source.

Figure 2A:
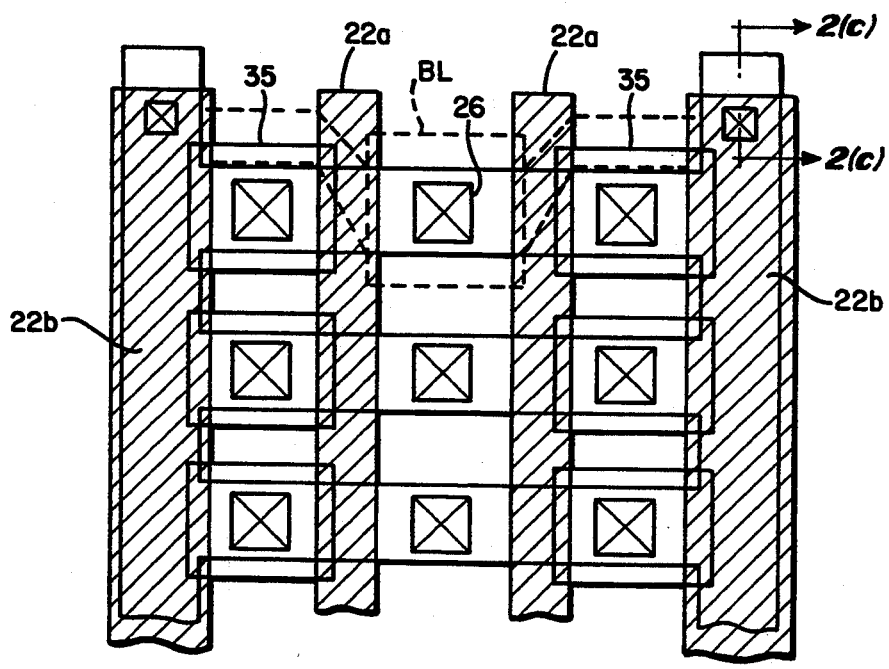
FIGS. 2(a) to 2(c) are a plan view, a plan view of an essential part and a schematic sectional view of A—A' line showing a structure of FRAM shown in FIG. 1.
Figure 2B:
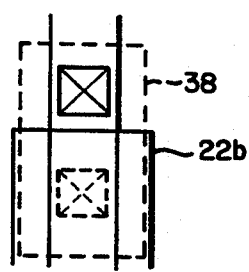
Figure 2C:
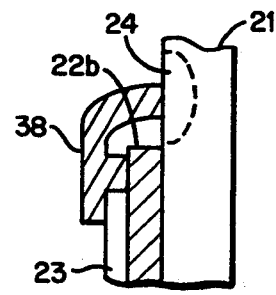

As shown in FIG. 2, the load transistor T12 of one unit cell shares a gate electrode (word line 22b) with other load transistors which are adjacent with each other in the extending direction of the gate electrode and the gate end of the load transistor is connected to a drain 24 (see FIG. 2(c)).

A manufacturing method for the above FRAM is described with reference to FIG. 3.

Figure 3A:
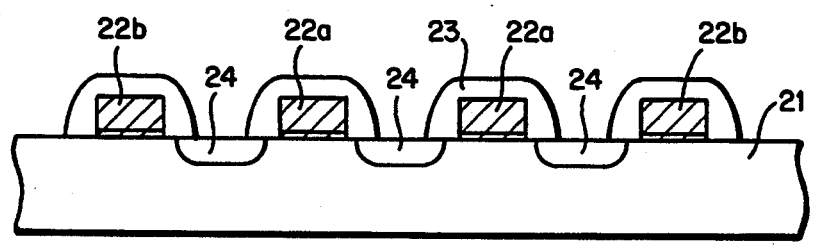
FIGS. 3(a) to 3(f) are schematic sectional view of an essential part illustrating the process for manufacturing the FRAM shown in FIG. 1.

As shown in FIG. 3(a), an active region is defined on silicon substrate 21 with a field oxide film (not shown). A gate electrodes 22a and 22b (a word line) formed by about 3500 angstroms thick polysilicon on the active region with a gate oxide film sandwiched therebetween. Next, SiO$_2$ film is deposited by the CVD method, followed by etching back to form a gate protective film 23.

Ions are implanted by using the gate electrode 22a and 22b and gate protective film 23 as a mask, thereby forming an N-type impurity diffused region 24.

Figure 3B:
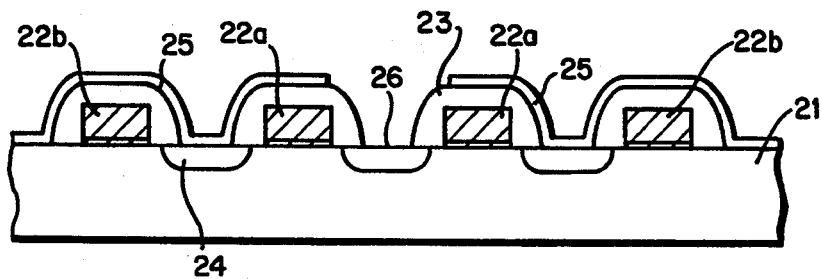

Next, NSG film 25 is formed with 500 angstroms in thickness on the silicon substrate 21 as shown in FIG. 3(b), then a region where a bit line is to be formed is etched to form a bit contact portion 26.

Figure 3C:
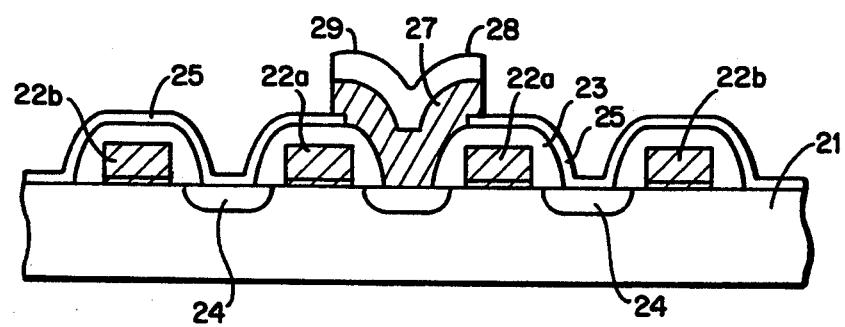

Then, the deposition of N+ polysilicon layer 27 to a thickness of about 1500 angstroms and tungsten silicate (WSix) layer 28 to a thickness of 1500 angstroms are followed by patterning to a desired shape to form a bit line 29 as shown in FIG. 3(c).

Figure 3D:
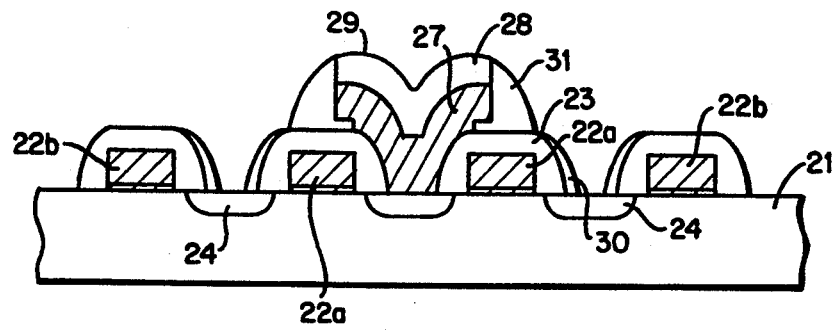

Next, $SiO_2$ is deposited with about 200 angstroms in thickness on the silicon substrate 21, followed by etching to form a side wall spacers 30 and 31 on the side wall of the gate electrodes 22a, 22b and a bit line 29 as shown in FIG. 3(d).

Figure 3E:
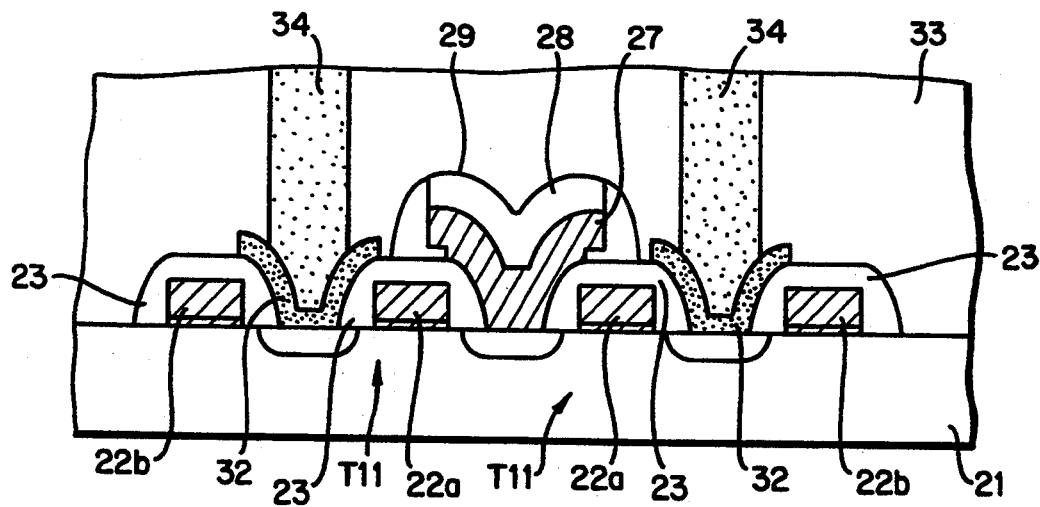

As shown in FIG. 3(e), polysilicon is deposited to a thickness of about 1500 angstroms on the whole surface of the gate electrodes 22a and 22b and the bit line 29, followed by etching the polysilicon except for the area above the bit contact portion 26 to form a contact pad 32 on the bit contact portion 26. A BPSG film 33 is further deposited thereon with a thickness of about 6000 angstroms, and heated at 900° C. for 20 minutes to reflow the BPSG film for flattening inside of the cell. Then, a contact hole is formed throughout the BPSG film 33 on the bit contact portion 26 with self-alignment. A contact plug 34 is formed by depositing tungsten on the substrate 21 including the contact hole, then followed by etching.

Figure 3F:
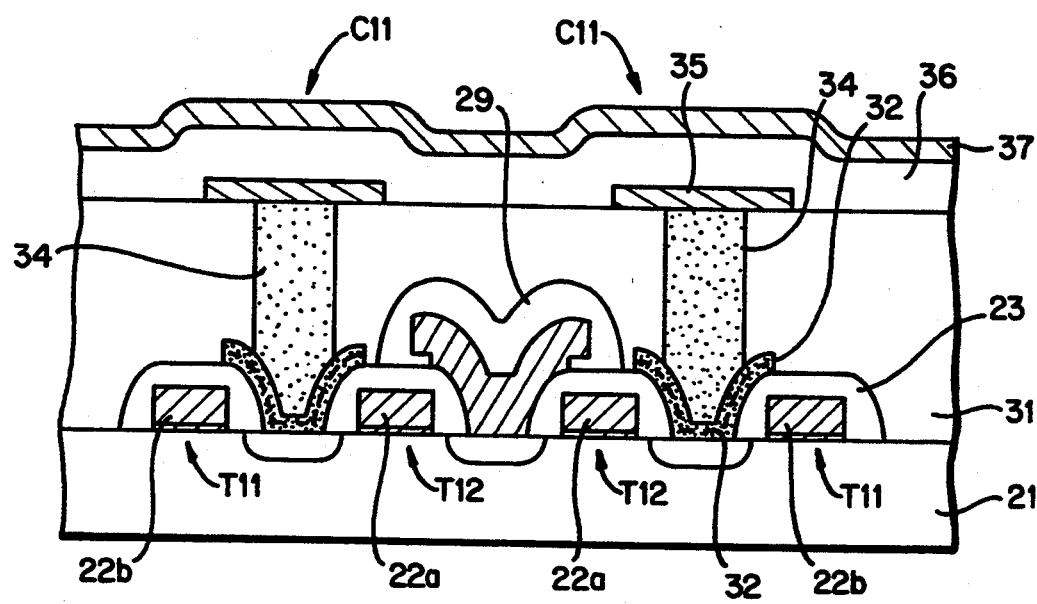

As shown in FIG. 3(f), Pt/Ti film is deposited to a thickness of about 1000/200 angstroms on the substrate 21 including the contact plug 34, followed by etching to a desired shape so as to connect it to the contact plug 34, thereby forming an accumulating electrode 35. Then, PZT film with about 2000 angstroms in thickness as a ferroelectric film 36 is formed by sputtering on the accumulating electrode 35, and then Pt/Ti film is deposited to a thickness of about 2500 angstroms, followed by etching to a desired shape, thereby forming a cell plate 37.

Figure 4:
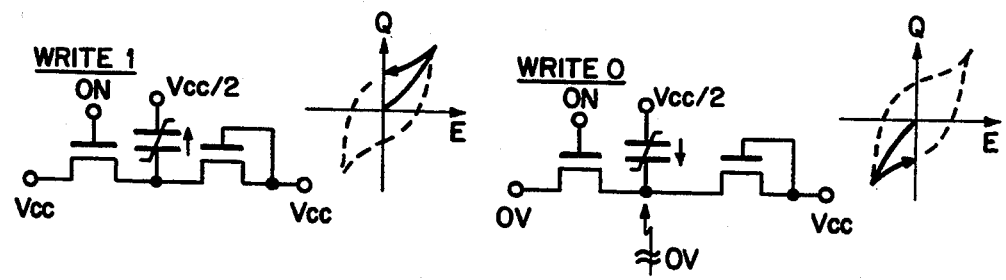
FIG. 4 is an equivalent circuit illustrating the behavior of the FRAM shown in FIG. 1.
Figure 4:
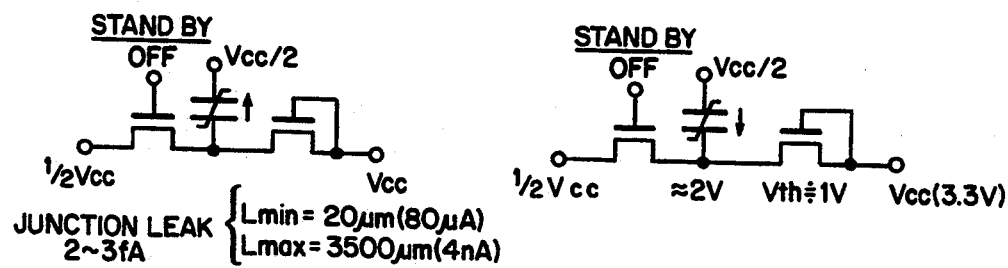
Figure 4:
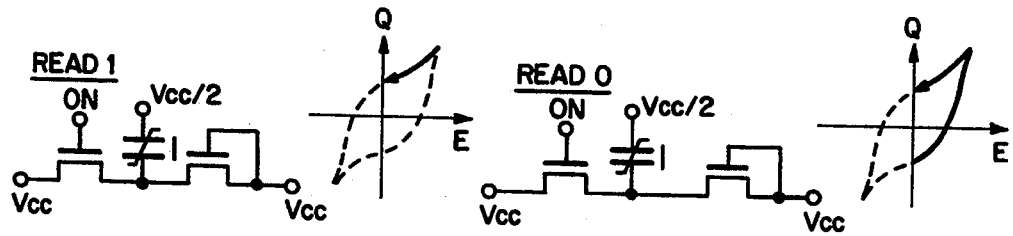

In the foregoing section, the behavior of one cell of the FRAM cell will be described by way of FIG. 4.

At the Time of Writing Data (Write 1 or Write 0)

Application of an electric potential of $V_{cc}/2$ to the cell plate of the capacitor device is followed by applying either $V_{cc}$ (in the case of Write 1) or 0 V (in the case of Write 0) to the bit line. Consequently, as shown in the figure, the charge of the residual polarization each exhibiting a polarization in the reverse direction in the state of Write 1 and Write 0 is accumulated and stored in the capacitor.

At the Time of Waiting

Since the threshold voltage Vth of the load transistor is about 1 V, the electric potential of the accumulating electrode is fixed to about 2 V ($V_{cc}=3$ to 3.3 V). Consequently, at the time of waiting, the electric potential of the cell plate is fixed to $V_{cc}/2$ and the state of polarization is kept as it is.

At the Time of Reading (Read 1 and Read 0)

The electric potential of the cell plate is fixed to $V_{cc}/2$ and a voltage of $V_{cc}$ is applied to the bit line. In the case of Read 1, the polarization is not reversed in the capacitor. On the other hand, in the case of Read 0, the polarization of the capacitor is reversed, so that the data "1" or "0" is read depending on a variation of the electric current.

In accordance with the above embodiment, since 1.5 transistors and one capacitor substantially constitute one FRAM, a non-volatile random access memory device is highly integrated. In addition, the load transistor can be made small compared with the conventional case. Therefore, the obtained cell of FRAM is smaller than that of the conventional type. For example, when the gate electrode is 0.5 μm rule, the cell size is reduced from about 3.7 $\mu m^2$ to 3.33 $\mu m^2$ (1.75×1.9), which means an 80 to 90% reduction.

Embodiment 2

Figure 5:
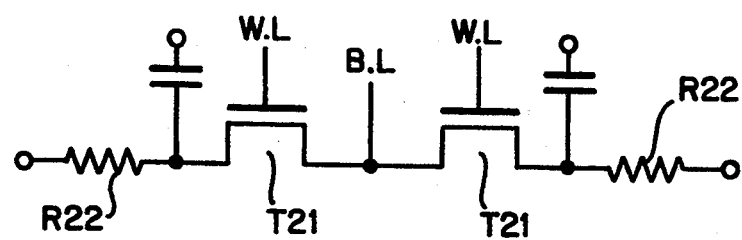
FIG. 5 is an equivalent circuit showing a FRAM of second embodiment of the present invention.

As shown in FIG. 5, a unit cell comprises a transistor T21, a capacitor C11 connected to a drain electrode D1 which is one of the electrode of the transistor T11, and a resistor R22 connected to the drain D1 of the transistor T11.

Figure 6:
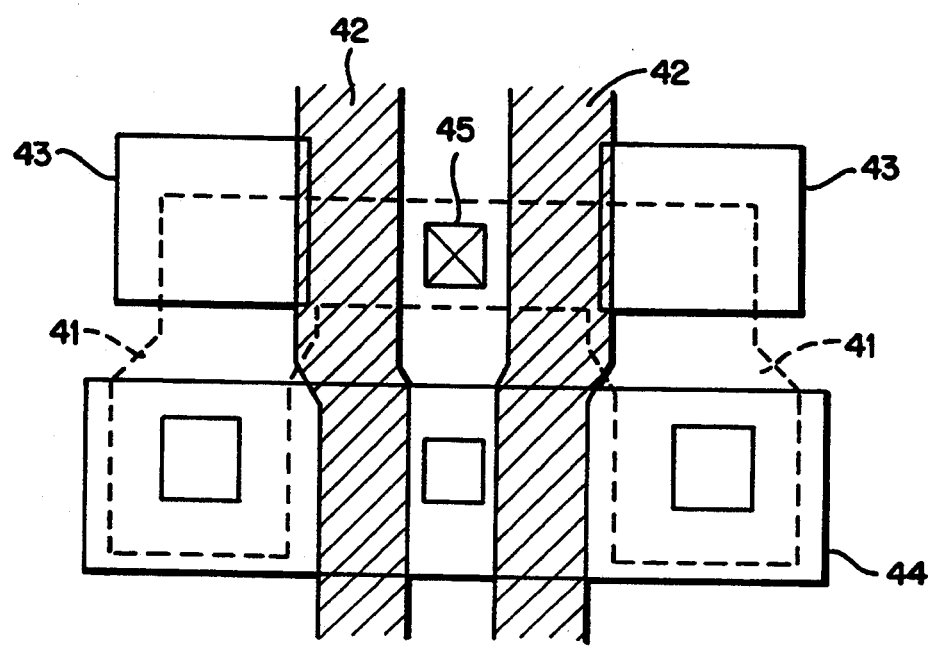
FIG. 6 is a plan view showing a structure of FRAM shown in FIG. 5.

In other words, as shown in FIG. 6, a gate electrode (a word line) 42 of the transistor T21 is formed on an active region 41. The drain of the transistor T21 is connected to a lower electrode 43 of the capacitor C11. A resistor forming a resistive layer 44 is connected to the drain of the transistor T21 independent of the capacitor C11. A contact portion 45 with the bit line is located between the word line 42 and another word line of the adjacent unit cell.

Embodiment 3

Figure 7:
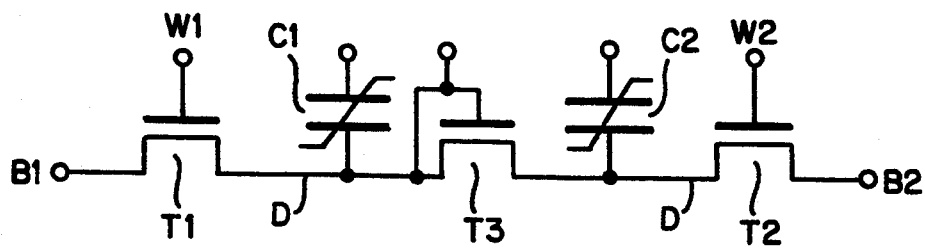
FIG. 7 is an equivalent circuit showing a FRAM of third embodiment of the present invention.
Figure 8:
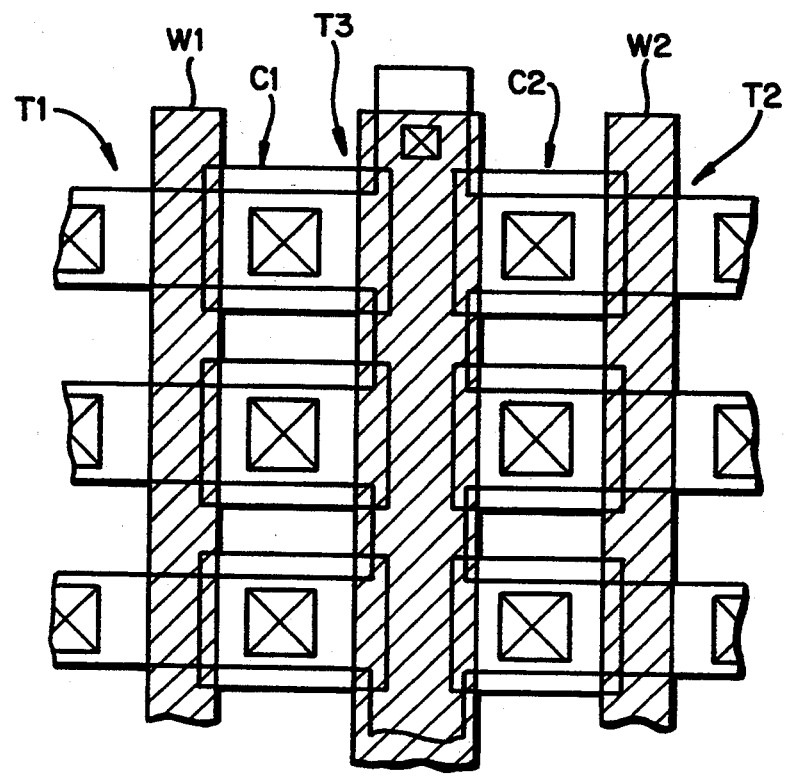
FIG. 8 is a plan view showing a structure of FRAM shown in FIG. 7.

As shown in FIGS. 7 and 8, a unit cell comprises a transistor T1 and a ferroelectric capacitor C1 connected to either electrode of the transistor T1 and a high load transistor T3. The high-load transistor T3 in one unit cell is shared with other unit cells which are adjacent to each other.

Embodiment 4

A unit cell comprises a transistor, a ferroelectric capacitor connected to either electrode of the transistor and a resistor (250 kΩ<). The resistor of this embodiment is shared other unit cells which are adjacent to each other.

In the subsequent section, a method for manufacturing a FRAM in FIG. 7 will be detailed.

Figure 9A:
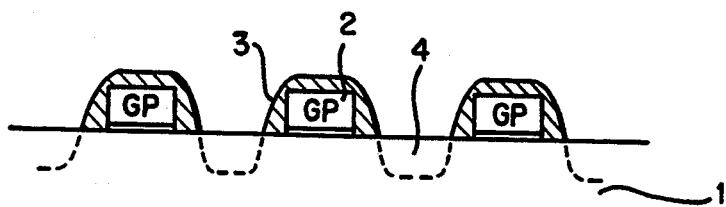
FIGS. 9(a) to 9(e) are schematic sectional view of an essential part illustrating the process for manufacturing the FRAM shown in FIG. 7.

At the outset, defining a device formation region by forming a device isolation region comprising a field oxide film on a silicon substrate 1 is followed by forming a gate electrode 2 (word line) formed of about 3500 angstroms thick polysilicon with a gate oxide film sandwiched therebetween on the device formation region. Later, a $SiO_2$ film is deposited with the CVD method and etched back to form a gate protecting film 3. Then ions are implanted with these gate electrodes 2 and the gate protecting film 3 using as a mask to form an N type impurity diffusion region 4. (FIG. 9(a)).

Figure 9B:
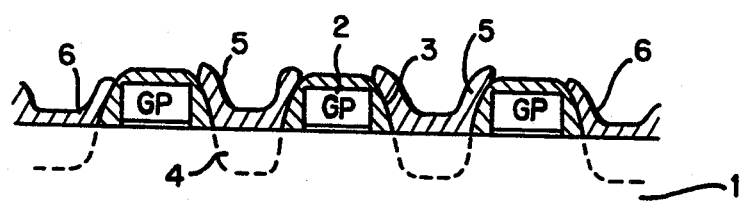

Then the deposition of polysilicon to a thickness of about 1500 angstroms is followed by patterning the deposited polysilicon, which forms a polysilicon film 5, 5 which will serve as a lower electrode for the capacitor device and a polysilicon film 6, 6 which will serve as a bit-line contact pad (FIG. 9(b)).

Figure 9C:
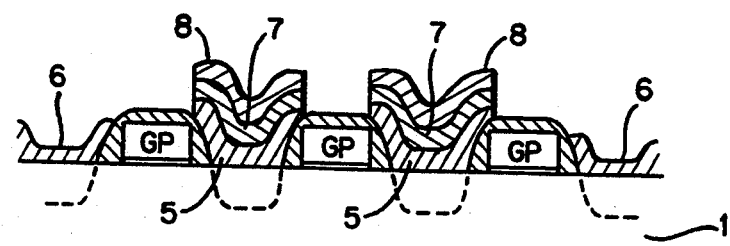

In the following process, on the gate electrode 2 and on the entire surface of the polysilicon films 5 and 6, Pt/TiN is deposited and a PZT film is formed to a thickness of about 2000 angstroms as a ferroelectric film with the sputtering process. Then a platinum film is further formed thereon to a thickness of about 2500 angstroms. After that, the PZT film 7 and the platinum film 8 are patterned into a desired configuration so that a capacitor insulating film is formed of the PZT film 7 and an upper electrode is formed of the platinum film 8 (FIG. 9(c)).

Figure 9D:
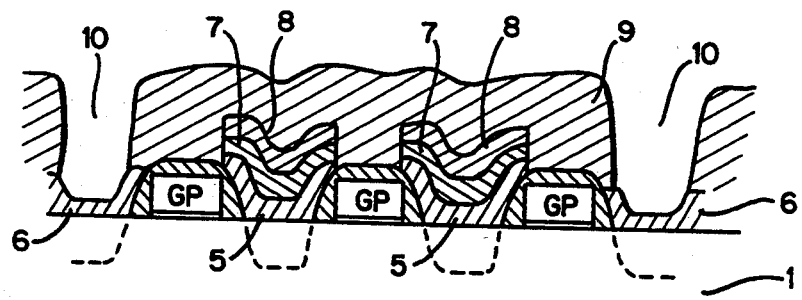

Later, as shown in FIG. 9(d), the entire surface is coated with a SiO$_2$ interlayer insulating film 9 having a thickness of about 7000 angstroms by applying a heat treatment for planerization at about 700° C., and then a bit-contact hole 10 is formed.

Figure 9E:
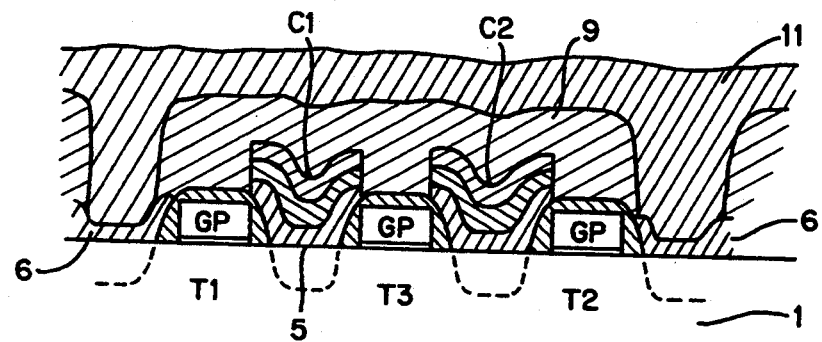
Figure 10:
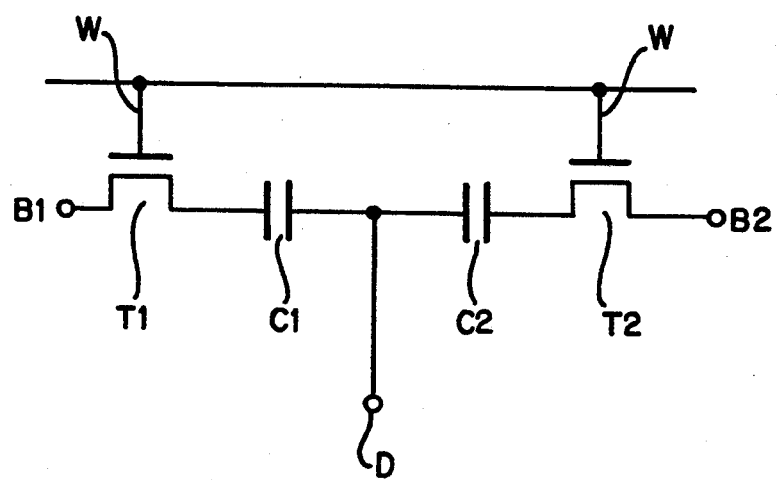
FIG. 10 is an equivalent circuit of a conventional FRAM.
Figure 11A:
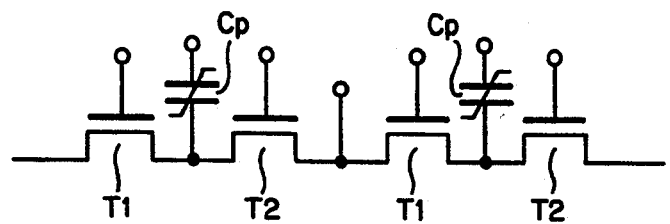
FIGS. 11(a) to 11(c) are a equivalent circuit, a plan view and a schematic sectional view of an essential part of another conventional FRAM.
Figure 11B:
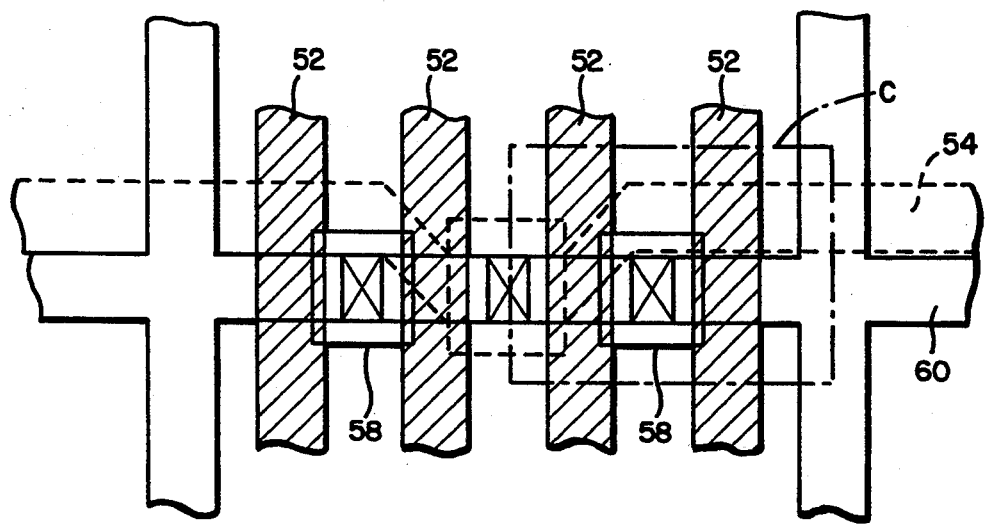
Figure 11C:
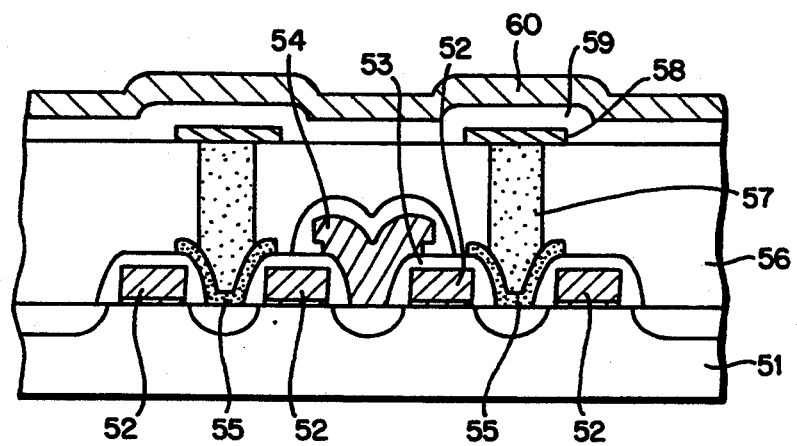
Figure 12:
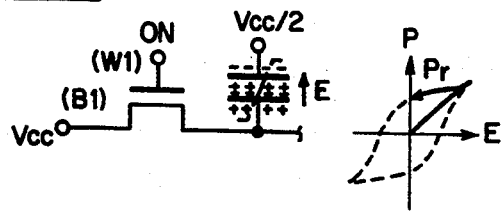
FIG. 12 is an equivalent circuit illustrating the behavior of still another conventional FRAM.
Figure 12:
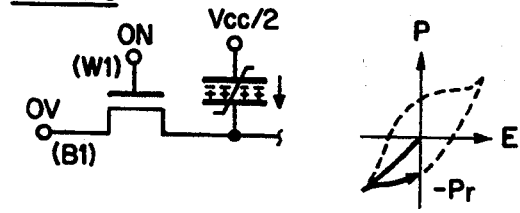
Figure 12:
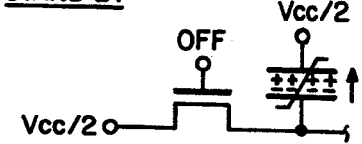
Figure 12:
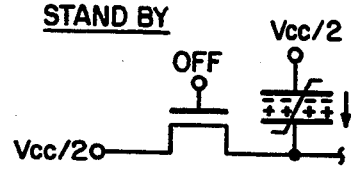
Figure 12:
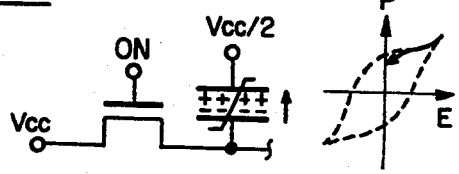
Figure 12:
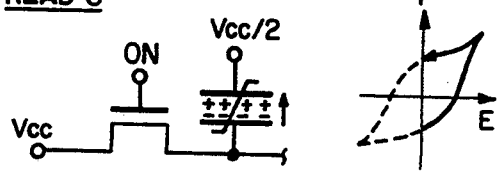

In the subsequent process, as shown in FIG. 9(e), Al is deposited to a thickness of about 4500 angstroms, which is patterned to form a metal wiring layer (bit line) 11 so that a FRAM can be given.

The FRAM thus manufactured has the following properties.

dielectric constant=1000 electric field E$_c$=30 KV/cm (0.9 V at 3000 angstroms)

residual polarization P$_r$=20 μc/cm$^2$ saturated polarization P$_s$=30 μc/cm$^2$ capacitor area 1.02 μm$^2$ (30 fF secured)

In accordance with the construction of the present invention, the source side of the capacitor device is connected to the high load transistor device (or resistor), the potential is kept on a high level there. Thus, the substantial elimination of the influence of the back gate V$_{BB}$ potential enables the operation of the non-volatile properties of the device; besides such high-load transistor device or resistor are commonly connected to the two memory cells with the result that the number of devices remarkably decreases compared with the conventional FRAM.

In other words, since one transistor device and one capacitor device substantially constitute one FRAM, a non-volatile random access memory device more highly integrated than the conventional memory is given. In addition, the voltage control at each transistor device T1 and T2 as well as each capacitor device C1 and C2 allows writing, reading and waiting for non-volatile data.

Further, according to the structure of FRAM of the present invention in which the memory cell is connected to a resistor or a high load type transistor, the electric potential can be fixed in the connected portion of the capacitor electrode with the substrate during the waiting period.

Therefore, reverse of the polarization and the lack of accumulated charges generated by the electric potential applied to the substrate during the waiting period can be prevented, thereby ensuring to repeat the function of the FRAM.

What is claimed is:

1. A non-volatile random access memory including a plurality of unit cells, each cell comprising:

a transistor composed of source and drain regions and a gate electrode, a ferroelectric capacitor having an accumulating electrode, a ferroelectric film and a cell plate wherein the accumulating electrode is connected to either of the source and drain regions, and a high load device connected to both of the accumulating electrode of the ferroelectric capacitor and the source or drain region connected to the ferroelectric capacitor, wherein the high load device provided in the cell is used with an adjacent cell in common.

2. A non-volatile random access memory including a plurality of trait cells, each cell comprising:

a transistor composed of source and drain regions and a gate electrode, a ferroelectric capacitor having an accumulating electrode, a ferroelectric film and a cell plate wherein the accumulating electrode is connected to either of the source and drain regions, wherein the ferroelectric capacitor covers a portion of the transistor and the high load device, and a high load device connected to both of the accumulating electrode of the ferroelectric capacitor and the source or drain region connected to the ferroelectric capacitor.

3. A non-volatile random access memory including a plurality of unit cells, each cell comprising:

a transistor composed of source and drain regions and a gate electrode, a ferroelectric capacitor having an accumulating electrode, a ferroelectric film and a cell plate wherein the accumulating electrode is connected to either of the source and drain regions, and a high load transistor connected to both of the accumulating electrode of the ferroelectric capacitor and the source or drain region connected to the ferroelectric capacitor, wherein the high load transistor comprises source and drain regions and a gate electrode, one of the source and drain regions being conductively coupled to the gate electrode of the high load transistor, the other of the source and drain regions in the high load transistor being conductively coupled to one of the source and drain regions of the transistor connected to the accumulating electrode of the ferroelectric capacitor.

4. The non-volatile memory of claim 3, wherein each of the plurality of cells is connected respectively to a plurality of word lines and bit lines, the gate of the high load transistor in each cell is connected to a common word line, and for each cell the source or drain region coupled to the gate electrode of the high load transistor are conductively coupled wherein gate electrode is shared between cells.

* * * * *